United States Patent [19]

Yaklin

[11] Patent Number: 5,534,770
[45] Date of Patent: Jul. 9, 1996

[54] METHOD AND DEVICE FOR RESISTIVE LOAD COMPENSATION

[75] Inventor: Daniel A. Yaklin, Garland, Tex.

[73] Assignee: Texas Instruments Incorporated, Dallas, Tex.

[21] Appl. No.: 180,943

[22] Filed: Jan. 12, 1994

Related U.S. Application Data

[63] Continuation of Ser. No. 991,726, Dec. 17, 1992, abandoned.

[51] Int. Cl.$^6$ .................................................. G05F 1/565
[52] U.S. Cl. ............................ 323/284; 323/274; 327/74
[58] Field of Search ...................................... 323/284, 283, 323/274; 307/360

[56] References Cited

U.S. PATENT DOCUMENTS

| | | | |
|---|---|---|---|
| 4,498,040 | 2/1985 | Tatsushi et al. | 323/313 X |
| 4,862,056 | 8/1989 | Goto et al. | 323/284 X |
| 5,045,832 | 9/1991 | Tam | 338/334 |
| 5,208,842 | 4/1993 | Atwood et al. | 377/55 |

Primary Examiner—Peter S. Wong
Assistant Examiner—Adolf Berhane
Attorney, Agent, or Firm—W. James Brady, III; Richard L. Donaldson

[57] ABSTRACT

A compensation circuit includes a first comparator (12) that compares a load signal (18) generated from a resistive load (16) to a first reference voltage (V1). A second comparator (14) compares the load signal (18) to a second reference voltage (V2). The range between the reference voltages (V1 and V2) determines compensation adjustments made to the resistive load (16). A counter circuit (20) increments or decrements a thermometer code count sequence (22) according to the comparisons made by the first and second comparators (12 and 14). The thermometer code count sequence (22) controls and adjusts the resistive load (16) in order to place the load signal (18) within the range of the reference voltages (V1 and V2). The counter circuit (20) prevents the count sequence from continuously rolling over whenever the load signal (18) exceeds the range of the reference voltages (V1 and V2) by more than the maximum compensation available.

15 Claims, 3 Drawing Sheets

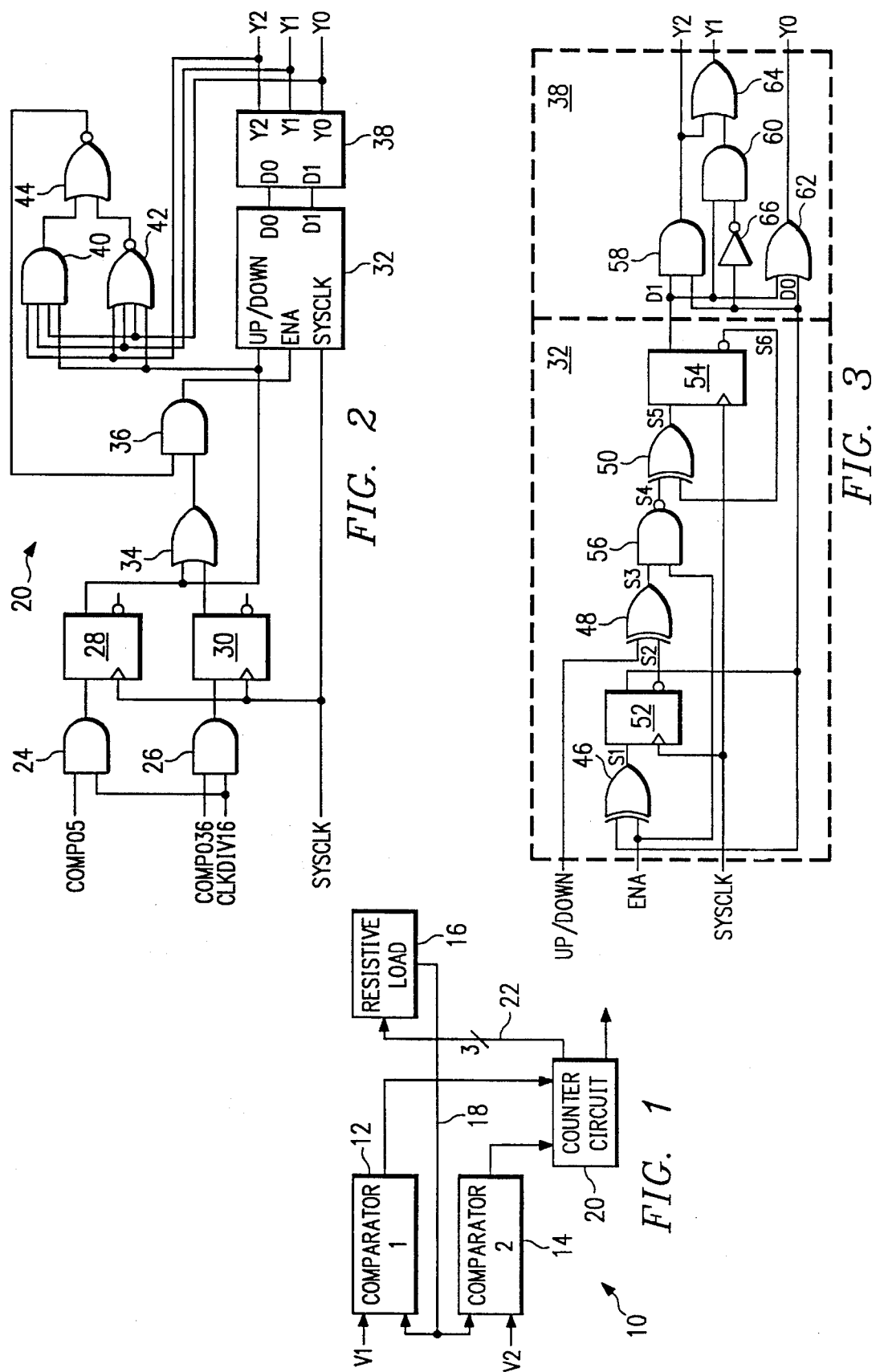

METHOD AND DEVICE FOR RESISTIVE LOAD COMPENSATION

This is a continuation of application Ser. No. 07/991,726, filed Dec. 17, 1992 now abandoned.

TECHNICAL FIELD OF THE INVENTION

This invention relates in general to integrated circuit technologies and more particularly to a method and device for resistive load compensation.

BACKGROUND OF THE INVENTION

Compensation circuits are widely used to adjust a resistive load, for example in a differential amplifier, that sustains parameter changes due to integrated circuit operation and temperature variation. Typically, the compensation circuit uses a counter to vary the required compensation for the circuit. The compensation circuit monitors the resistive load and increments or decrements that counter whenever the resistive load falls outside a desired range. By appropriately incrementing or decrementing the counter, the resistive load can be adjusted back within the desired range.

Conventional compensation circuits allow the counter to continuously roll over if the resistive load could not be compensated within the desired range. This roll over effect by the counter would cause the compensation circuit to malfunction and endlessly count through the entire compensation range. Therefore, it is desirable to have a compensation circuit which prevents the counter from rolling over and causing a malfunction of the compensation circuit.

From the foregoing it may be appreciated that a need has arisen for a compensation circuit that does not malfunction when compensating an out of range resistive load. A need has also arisen for a compensation circuit that prevents a counter from endlessly rolling over in response to an out of range resistive load.

SUMMARY OF THE INVENTION

In accordance with the present invention, a method and device for compensating a resistive load are provided which substantially eliminate or reduce disadvantages and problems associated with conventional compensation circuits.

The present invention includes circuitry for comparing a load signal to a first reference voltage and a second reference voltage in order to determine if the load signal is within a desired range. If the load signal does not fall within the desired range, circuitry is included for incrementing or decrementing a count sequence in response to the load signal comparison. The count sequence drives circuitry that adjusts the resistive load in response to the load signal comparison. When the count sequence reaches a minimum or maximum value, circuitry is included for stopping the count sequence and preventing the count sequence from continuously rolling over.

The method and device of the present invention provide for various technical advantages. For example, one technical advantage is to provide a compensation circuit that does not malfunction when the resistive load cannot be compensated to fall within a desired range. Another technical advantage is to prevent a counter from continuously rolling over whenever the resistive load cannot be compensated to fall within the desired range. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 illustrates a block diagram of a resistive load compensation circuit;

FIG. 2 illustrates a simplified schematic diagram of a counter circuit for the preferred compensation circuit;

FIG. 3 illustrates a simplified schematic diagram of a counter for the preferred counter circuit;

DETAILED DESCRIPTION OF THE INVENTION

Figure 4:
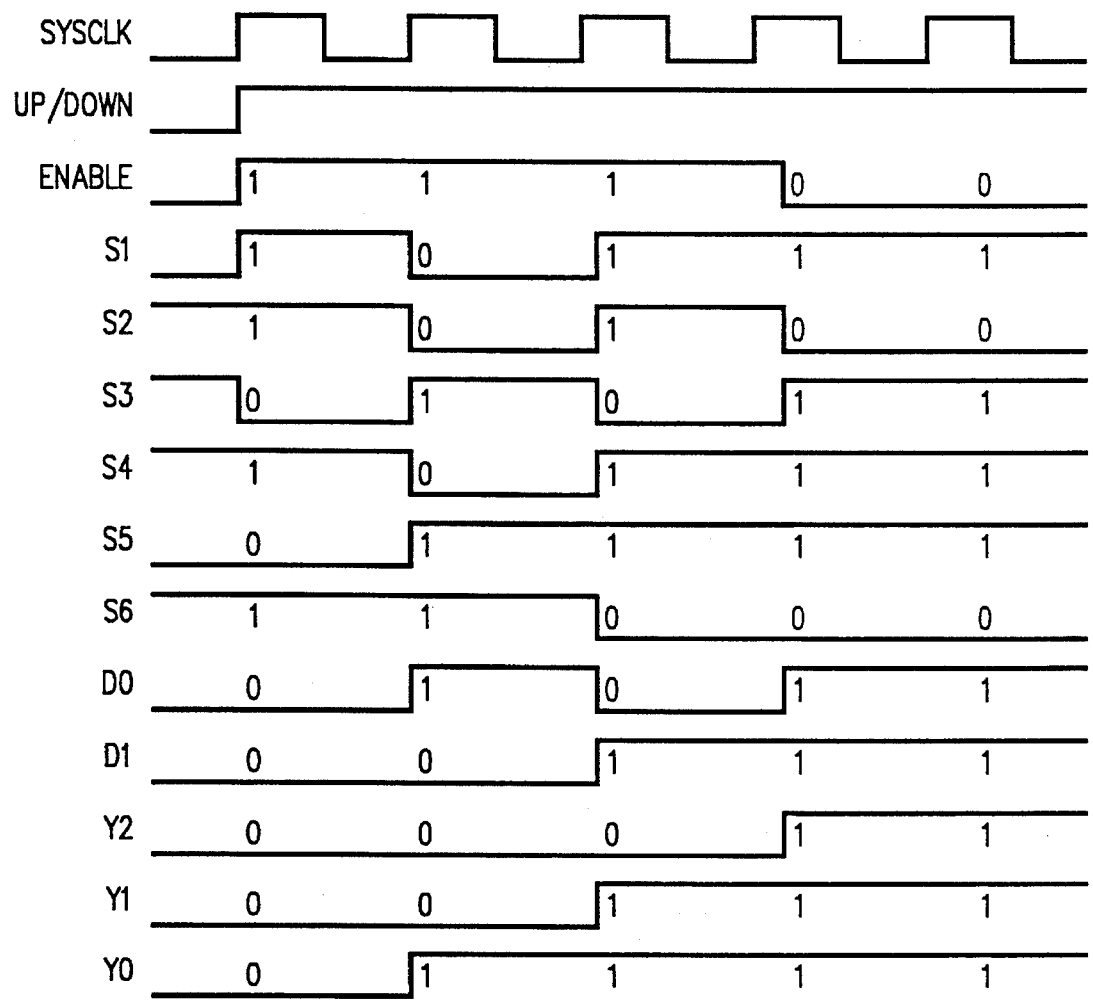
FIG. 4 illustrates a timing diagram for the counter during an increment process.

FIG. 1 is a block diagram of a device 10 for compensating a resistive load. Device 10 includes a first comparator 12 receiving a first reference voltage V1 and a second comparator 14 receiving a second reference voltage V2. A resistive load circuit 16 generates a load signal 18 for first comparator 12 and second comparator 14. A counter circuit 20 receives a signal from first comparator 12 and a signal from second comparator 14 and generates a count sequence 22 to control resistive load circuit 16.

In operation, device 10 ensures that resistive load 16 does not fall outside the range established by first reference voltage V1 and second reference voltage V2. If load signal 18 does fall outside the range of first and second reference voltages V1 and V2, counter circuit 20 will increment or decrement count sequence 22 accordingly to adjust resistive load circuit 16, returning load signal 18 to within the range of first and second reference voltages V1 and V2. Counter circuit 20 ensures that count sequence 22 does not continuously roll over if resistive load circuit 16 cannot be adjusted to place load signal 18 within the range of first and second reference voltages V1 and V2.

FIG. 2 is a simplified schematic diagram of counter circuit 20. Counter circuit 20 receives a signal COMP05 from first comparator 12 at an AND gate 24. Counter circuit 20 also receives a signal COMP036 from second comparator 14 at an AND gate 26. These signals are clocked into their respective AND gates by a signal CLKDIV16. A D-type flip flop 28 takes the result of AND gate 24 and latches the result in response to a signal SYSCLK. Similarly, a D-type flip flop 30 takes the result of AND gate 26 and latches the result in response to signal SYSCLK. Flip flop 28 drives a signal UP/DOWN for a counter 32. Counter 32 increments when signal UP/DOWN is at a logic zero level and decrements when signal UP/DOWN is at a logic one level. An OR gate 34 receives the latch signals from the first and second comparators, driving an AND gate 36 that drives a signal ENABLE at counter 32.

Whenever load signal 18 is within the range of reference voltage signals V1 and V2, the latch signals entering OR gate 34 from the first and second comparators are at a logic zero level. The resulting logic zero level output from OR gate 34 drives AND gate 36, producing a logic zero level at signal ENABLE of counter 32. A logic zero level at signal ENABLE disables counter 32, halting the count sequence in progress. Whenever load signal 18 is not within the range of reference voltages V1 and V2, one of the latch signals from the first or second comparator is at a logic one level depending on whether load signal 18 is below or above the range defined by reference voltages V1 and V2. The resulting logic one level output of OR gate 34 drives AND gate 36, producing a logic one level on signal ENABLE, allowing counter 32 to increment or decrement depending on the status of signal UP/DOWN.

Counter 32 generates a count sequence through outputs D0 and D1 to drive a thermometer decoder 38. Thermometer decoder 38 processes the count sequence received from counter 32 and generates a thermometer code count sequence at outputs Y2, Y1, and Y0. Outputs Y2, Y1, and Y0 adjust and control resistive load 16 as required by device 10. Outputs Y2, Y1, and Y0 feed AND gate 40 which generates a logic one level signal whenever the thermometer coded count sequence reaches its maximum value while counter 32 is in an increment mode. Outputs Y2, Y1, and Y0 also feed a NOR gate 42 which generates a logic one level signal when the thermometer coded count sequence reaches a minimum value during a decrement mode of counter 32. A logic one level signal at the output of either AND gate 40 or NOR gate 42 produces a logic zero level output from a NOR gate 44, causing AND gate 36 to generate a logic zero level signal on signal ENABLE and disable counter 32. In this manner, counter 32 is not allowed to continuously roll over in the event the thermometer code sequence reaches its maximum value during an increment mode or reaches its minimum value during a decrement mode.

FIG. 3 is a simplified schematic diagram of counter 32 and thermometer decoder 38. Counter 32 includes exclusive-or gates 46, 48, and 50 tied to flip flops 52 and 54 and a NAND gate 56 as shown. Counter 32 generates signals D1 and D0 which increment from 00 to 01 to 10 to when signal UP/DOWN is at a logic one level. Signals D1 and D0 decrement from 11 to 10 to 01 to 00 when signal UP/DOWN is at a logic zero level. Signals D1 and DO drive thermometer decoder 38.

Thermometer decoder 38 includes AND gates 58 and 60 tied to OR gates 62 and 64 and NOT gate 66 as shown. Thermometer decoder 38 generates outputs Y2, Y1, and Y0 which range from 000 to 001 to 011 to 111 during increment mode corresponding to the range of values on signals D1 and D0. Output signals Y2, Y1, and Y0 also range from 111 to 011 to 001 to 000 during decrement mode corresponding to the flow of values on signals D1 and D0.

FIG. 4 is a timing diagram showing signals within counter 32 and thermometer decoder 38 when counter 32 is incrementing. The timing diagram shows how the thermometer code count sequence of output signals Y2, Y1, and Y0 proceed from a minimum value to a maximum value. When the maximum value of the thermometer code count sequence is reached and counter 32 is still commanded to increment, AND gate 40 senses that the thermometer code count sequence has reached its maximum value and generates a signal that forces AND gate 36 to disable counter 32. By disabling counter 32, maximum compensation of resistive load available from compensation circuit 10 is maintained. Counter 32 is prevented from rolling over, even though load signal 18 does not fall within the range defined by reference voltages V1 and V2, and malfunctioning of device 10 is avoided.

Figure 5:
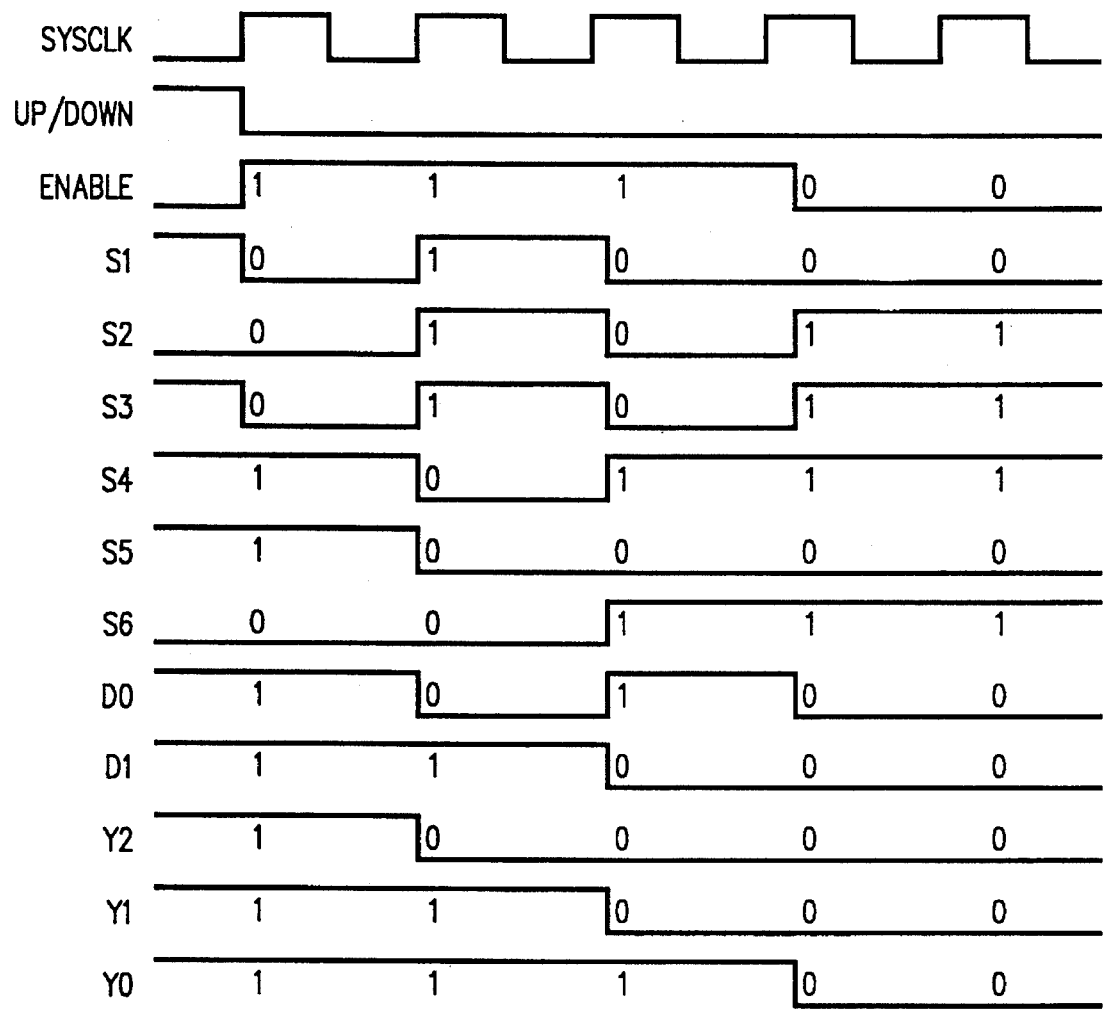
FIG. 5 illustrates a timing diagram for the counter during a decrement process.

FIG. 5 is a timing diagram of counter circuit 20 during decrement mode. The timing diagram shows that output signals Y2, Y1, and Y0 range from a maximum value to a minimum value. When output signals Y2, Y1, and Y0 reach a minimum value and counter 32 is still commanded to decrement, NOR gate 42 senses that the minimum value has been reached and generates a signal causing AND gate 36 to disable counter 32. By disabling counter 32, the maximum compensation of resistive load 16 available from compensation circuit 10 is maintained. Outputs Y2, Y1, and Y0 remain at the minimum value without being continuously rolled over. In this manner, rollover of counter 32 is prevented, even though load signal 18 does not fall within the range defined by reference voltages V1 and V2 and malfunctioning of device 10 is avoided.

Typically, the count sequence represented by output signals Y2, Y1, and Y0 activate or deactivate transistors within resistive load circuit 16 depending on the logic level of output signals Y2, Y1, and Y0. The transistors within resistive load circuit 16 control the strength of load signal 18. A specific number of transistors are turned on, from zero to all of them, to place the load signal within the desired range established by reference voltages V1 and V2. Resistive load circuit 16 acts as a test bed to set the level of output signals Y2, Y1, and Y0 for other active resistive load circuits.

Load signal 18 falling below the desired range indicates that too much resistance occurs in resistive load 16 and too much voltage drop occurs across the transistors. To reduce the impedance and pull the voltage on load signal 18 closer to the supply voltage of the circuit, more transistors must be turned on. To turn on more transistors, counter 32 increments the count sequence to cause more individual bits that control the transistors to toggle to the logic one level state. In this manner, load signal 18 is adjusted and compensated back toward the desired range.

Conversely, load signal 18 rising above the desired range indicates that the impedance is too low, pulling the voltage of load signal 18 too close to the supply voltage of the circuit. To increase the resistance on load signal 18, transistors within resistive load 16 must be shut off. To turn off transistors, counter 32 decrements the count sequence to reduce the number of individual bits within the count sequence that activate transistors within resistive load 16. In this manner, load signal 18 is adjusted and compensated back toward the desired range.

In summary, a compensation circuit avoids malfunctioning by preventing a count sequence that controls a resistive load from rolling over whenever the maximum compensation is reached and the resistive load fails to fall within the desired range. A counter is disabled whenever the count sequence maximum value is reached during an increment mode or the minimum value is reached during a decrement mode.

Thus, it is apparent that there has been provided, in accordance with the present invention, a method and device for compensating a resistive load that satisfies the advantages set forth above. Although the preferred embodiment has been described in detail, it should be understood that various changes, substitutions, and alterations can be made herein. For example, many of the direct connections illustrated herein could be altered by one skilled in the art such that two devices are merely coupled to one another through an intermediate device or devices without being directly connected as illustrated in the preferred embodiment. Also, one skilled in the art may appreciate that the thermometer code count sequence may include any number of individual bits and not be confined to three bits as shown in the preferred embodiment. These changes would still fall within the intended scope of the present invention and thus would not depart from the spirit and scope of the invention as defined by the following claims.

What is claimed is:

1. A device for compensating a load, comprising:

circuitry for comparing a load signal to a first reference voltage and to a second reference voltage;

circuitry for incrementing a count sequence in response to said load signal being greater than said first reference signal and for decrementing said count sequence in response to said load signal being less than said second reference voltage;

circuitry for stopping said count sequence when said count sequence reaches a minimum or maximum value; and circuitry for controlling a load in response to said count sequence.

2. The device of claim 1, wherein said stopping circuitry monitors individual bits of said count sequence to determine if said count sequence has reached said minimum or maximum value.

3. The device of claim 2, wherein said stopping circuitry disables said incrementing circuitry when said count sequence reaches said maximum value.

4. The device of claim 2, wherein said stopping circuitry disables said decrementing circuitry when said count sequence reaches said minimum value.

5. The device of claim 1, wherein said stopping circuitry disables said count sequence when said load signal falls between said first and second reference voltages and when said count sequence reaches said minimum and maximum values.

6. The device of claim 1, wherein said stopping circuitry includes a NOR gate to determine when said count sequence reaches said minimum value.

7. A device for compensating a load within a circuit, comprising:

a first comparator for comparing a first reference voltage to a load signal;

a second comparator for comparing a second reference voltage to said load signal;

an up/down counter for incrementing and decrementing a count sequence in response to said first and second comparators;

a latch circuit for disabling said up/down counter when said count sequence reaches a minimum or maximum value; and a load circuit for adjusting said load signal in response to said count sequence.

8. The device of claim 7, wherein said first comparator generates an up/down signal having a logic high signal level to decrement said count sequence when said load signal is less than said first reference voltage.

9. The device of claim 11, wherein said up/down signal has a logic low signal level to increment said count sequence when said load signal is greater than said first reference voltage.

10. The device of claim 9, wherein said up/down counter is disabled when said load signal falls between said first and second reference voltages or when said count sequence reaches said minimum or maximum value.

11. The device of claim 10, wherein said latch includes a NOR gate for determining when said count sequence reaches said minimum value.

12. A method of compensating a load within a circuit, comprising the steps of:

generating a load signal to indicate an amount of resistive load within the circuit;

comparing said load signal to a first reference voltage;

comparing said load signal to a second reference voltage;

incrementing a count sequence when said load signal is less than said first reference voltage;

disabling said incrementing step when said count sequence reaches a maximum value; and controlling said load signal in response to said count sequence.

13. The method of claim 12, further comprising the steps of:

decrementing said count sequence when said load signal is greater than said second reference voltage;

disabling said decrementing step when said count sequence reaches a minimum value.

14. The method of claim 13, wherein said disabling steps include comparing individual bits of said count sequence to determine said minimum or maximum value.

15. The method of claim 14, further comprising the step of:

disabling said incrementing and decrementing steps when said load signal falls within a range defined by said first reference voltage and said second reference voltage.

* * * * *